United States Patent
Brocke et al.

(10) Patent No.: US 11,171,482 B2
(45) Date of Patent: Nov. 9, 2021

(54) OVERVOLTAGE PROTECTION DEVICE WITH MONITORING AND COMMUNICATION FUNCTIONS

(71) Applicant: DEHN + SÖHNE GMBH + CO. KG, Neumarkt/Opf. (DE)

(72) Inventors: Ralph Brocke, Oberpörlitz (DE); Peter Zahlmann, Neumarkt (DE)

(73) Assignee: DEHN SE + CO KG, Neumarkt/Opf. (DE)

( * ) Notice: Subject to any disclaimer, the term of this patent is extended or adjusted under 35 U.S.C. 154(b) by 173 days.

(21) Appl. No.: 16/323,639

(22) PCT Filed: Jul. 25, 2017

(86) PCT No.: PCT/EP2017/068716
§ 371 (c)(1),
(2) Date: Feb. 6, 2019

(87) PCT Pub. No.: WO2018/041474
PCT Pub. Date: Mar. 8, 2018

(65) Prior Publication Data
US 2019/0207387 A1    Jul. 4, 2019

(30) Foreign Application Priority Data

Aug. 31, 2016 (DE) .......................... 102016116210.8
Dec. 29, 2016 (DE) .......................... 102016125900.4

(51) Int. Cl.
*H02H 9/04* (2006.01)
*G01R 31/12* (2020.01)
(Continued)

(52) U.S. Cl.
CPC ......... *H02H 9/042* (2013.01); *G01R 31/1236* (2013.01); *H02H 1/0007* (2013.01);
(Continued)

(58) Field of Classification Search
CPC .. H02H 9/04; H02H 9/06; H02H 1/00; H02H 9/042; H02H 9/043; H02H 1/0007;
(Continued)

(56) References Cited

U.S. PATENT DOCUMENTS

| 8,724,276 B2 | 5/2014 | Igl et al. ..................... 361/91.1 |
| 10,074,973 B2 | 9/2018 | Durth et al. |

(Continued)

FOREIGN PATENT DOCUMENTS

| DE | 102006034164 A1 | 11/2007 | ............... H01R 9/26 |
| DE | 102006034164 B4 | 7/2008 | ............... H01R 9/26 |

(Continued)

OTHER PUBLICATIONS

Notification Concerning Transmittal of International Preliminary Report on Patentability (Chapter I of the Patent Cooperation Treaty), in English, dated Mar. 14, 2019, which was issued by the International Bureau of WIPO in Applicant's corresponding international PCT application having Serial No. PCT/EP2017/068716, filed on Jul. 25, 2017.

(Continued)

*Primary Examiner* — Danny Nguyen
(74) *Attorney, Agent, or Firm* — Bodner & O'Rourke, LLP; Gerald T. Bodner; Christian P. Bodner

(57) ABSTRACT

The invention relates to an overvoltage protection device with monitoring and communication functions, in particular for the information and process industries, having at least one surge arrester with a self-diagnostics unit and a wireless and/or wired standard interface for data transmission. According to the invention, an additional module is provided to detect the behaviour and/or the properties of a connected electrical energy source, wherein a bidirectional exchange of data and commands to and between a higher-level control system and among multiple overvoltage pro- (Continued)

tection devices takes place and parametrisation of lower-level terminals to be protected can be realised via the standard interface.

4 Claims, 1 Drawing Sheet

(51) Int. Cl.
*H02H 1/00* (2006.01)
*H02H 9/06* (2006.01)
*H02H 3/04* (2006.01)

(52) U.S. Cl.
CPC .............. *H02H 9/043* (2013.01); *H02H 9/06* (2013.01); *H02H 1/0061* (2013.01); *H02H 3/048* (2013.01); *H02H 9/04* (2013.01)

(58) Field of Classification Search
CPC .... G01R 31/12; G01R 31/1236; G01R 31/02; G01R 1/38; H01H 89/00; H01H 85/12; H01H 85/18; H01H 85/00; H01H 39/00; H01H 39/006; H01H 85/0039; H01H 85/185
USPC .................................................. 361/117–119
See application file for complete search history.

(56) References Cited

U.S. PATENT DOCUMENTS

| | | | | |
|---|---|---|---|---|
| 2004/0066598 | A1* | 4/2004 | Gudmundsson | H02H 3/048 361/118 |
| 2008/0100436 | A1 | 5/2008 | Banting et al. | |
| 2012/0239321 | A1* | 9/2012 | Normoyle | H02H 9/042 702/58 |
| 2014/0176336 | A1* | 6/2014 | Li | G01R 31/50 340/870.01 |
| 2016/0261106 | A1* | 9/2016 | Westerlund | H02H 3/04 |

FOREIGN PATENT DOCUMENTS

| | | | | |
|---|---|---|---|---|
| DE | 102009022832 A1 | 4/2010 | ............... | H02H 9/04 |
| DE | 202012010818 U1 | 11/2012 | ............... | H02J 13/00 |
| DE | 102014219913 A1 | 4/2016 | ............... | H02H 9/04 |
| EP | 2333925 A1 | 6/2011 | ............... | H02H 9/04 |
| WO | WO2015055233 A1 | 4/2015 | ............... | H02H 3/04 |

OTHER PUBLICATIONS

English translation of the International Preliminary Report on Patentability (Chapter I of the Patent Cooperation Treaty), dated Mar. 5, 2019, which was issued by the International Bureau of WIPO in Applicant's corresponding international PCT application having Serial No. PCT/EP2017/068716, filed on Jul. 25, 2017.
Written Opinion of the International Searching Authority, in English, dated Nov. 9, 2017, which was issued by the International Bureau of WIPO in Applicant's corresponding international PCT application having Serial No. PCT/EP2017/068716, filed on Jul. 25, 2017.
International Search Report, in English, dated Nov. 9, 2017, which was issued by the International Bureau of WIPO in Applicant's corresponding international PCT application having Serial No. PCT/EP2017/068716, filed on Jul. 25, 2017.

* cited by examiner

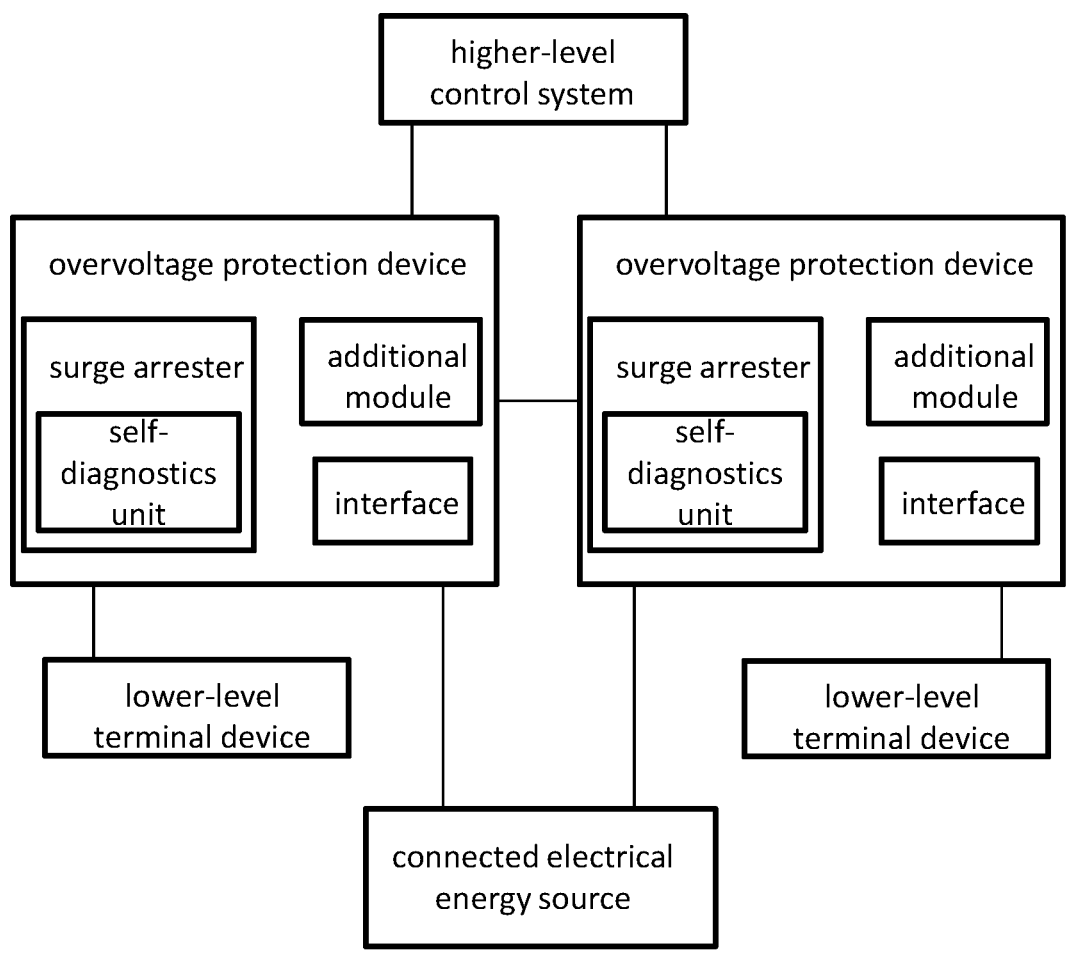

OVERVOLTAGE PROTECTION DEVICE WITH MONITORING AND COMMUNICATION FUNCTIONS

CROSS-REFERENCE TO RELATED APPLICATIONS

Not Applicable

STATEMENT REGARDING FEDERALLY SPONSORED RESEARCH OR DEVELOPMENT

Not Applicable

THE NAMES OF THE PARTIES TO A JOINT RESEARCH AGREEMENT

Not Applicable

INCORPORATION-BY-REFERENCE OF MATERIAL SUBMITTED ON A COMPACT DISC OR AS A TEXT FILE VIA THE OFFICE ELECTRONIC FILING SYSTEM (EFS-WEB)

Not Applicable

STATEMENT REGARDING PRIOR DISCLOSURES BY THE INVENTOR OR A JOINT INVENTOR

Not Applicable

BACKGROUND OF THE INVENTION

(1) Field of the Invention

The invention relates to an overvoltage protection device with monitoring and communication functions for the information and process industries, having at least one surge arrester with a self-diagnostics unit and a wireless and/or wired standard interface for data transmission according to claim 1.

(2) Description of Related Art

From DE 10 2006 034 164 B4, a multipole lightning current arrester and/or surge arrester in series terminal configuration is already known. This surge arrester preferably serves the purpose of protecting devices and equipment of information technology and consists of a base part configured as a feed-through terminal, and plug-in modules which can be inserted in the base part and having protective elements for top hat rail mounting.

According to the embodiment there, a circuit board is provided which features a facility for wireless fault and status monitoring, for example in the form of an RFID transponder. The circuit board may also include means for temperature monitoring the protective elements situated on the remaining circuit boards. Such means may be temperature sensors each being situated downstream of, in particular facing the protective elements.

Thus, the already known surge arrester has a self-diagnostics unit in this respect.

According to the smart meter according to DE 20 2012 010 818 U1, the smart meter features an electronics system for detecting the current consumption and for outputting data representing the current consumption via a data communication interface.

According to a preferred embodiment, a LAN interface is provided for reading and programming the smart meter, while at least one further interface and the electronics system of the smart meter are arranged to serve the purpose of controlling other external devices which may then be controlled, for example, via a field bus system by the smart meter likewise connected to the field bus system.

It is also possible for a Web server to be integrated in the housing of the smart meter so that the current consumption detected by the smart meter can be retrieved by external devices, for example, also by mobile phones through a suitable software (app) via the Internet.

The overvoltage protection device with monitoring function according to DE 10 2014 219 913 A1 has a special circuit arrangement in the manner of a Wheatstone measurement bridge in order to identify the status of the overvoltage protection elements present there in a temporally immediate way.

For status control, temporary but also recurring measurements may be performed alternatively or in addition.

Local signaling of the status may be performed, for example, by an optical and/or acoustic signal or a display. Remote signaling may be realized by remote messaging, for example, via an automation bus or in general by means of telecommunication.

The solutions of the prior art are capable, independently or additionally to known thermal separating devices, of successfully responding to surge arresters used for status changes and bringing the identified status to an external evaluation via self-diagnostics units, which, in the case of planned inspection or maintenance work, consists in replacing already damaged surge arresters as a precaution.

The data obtained in this respect, however, are not utilized for further purposes.

BRIEF SUMMARY OF THE INVENTION

From the aforementioned, a task of the invention is to propose a more sophisticated overvoltage protection device with monitoring and communication functions, in particular for the information and process industries, which is not limited to remotely signal the operating status of surge arresters used but rather provides diagnosed measurement values and data for external use.

The task of the invention is solved by the teaching according to claim 1, with the dependent claims representing at least appropriate configurations and improvements.

BRIEF DESCRIPTION OF THE SEVERAL VIEWS OF THE DRAWINGS(S)

FIG. 1 is a block diagram of the overvoltage protection device according to the present invention.

DETAILED DESCRIPTION OF THE INVENTION

Accordingly, an overvoltage protection device with monitoring and communication functions is taken as a basis. The overvoltage protection device according to the invention is in particular suitable for being used in the information and process industries and takes at least one surge arrester with a self-diagnostics unit and a wireless and/or wired standard interface for data transmission or data transfer as a basis.

According to the invention, the overvoltage protection device has at least one further additional module. This further additional module is provided to detect the behavior and/or the properties of a connected electrical network or a connected electrical energy source.

Thus, apart from load values of the components of the surge arresters such as temperature, surge currents, follow current, response frequency, etc., pieces of information can also be evaluated which can be derived from integrated power quality modules. Harmonics, voltage drops or the like should be mentioned here, for example.

In contrast to previous solutions, the standard interface is not only of unidirectional but also of bidirectional organization and enables a corresponding bidirectional exchange of data and commands both to a higher-level control system and between the higher-level control system and the actual overvoltage protection device. Moreover, it is possible to organize a data exchange between a plurality of overvoltage protection devices according to the invention by forming a system of coupled overvoltage protection devices which furthermore parametrize mutually or with interconnection of a control system.

The teaching according to the invention thus enables individual functions of the surge arresters used but also of the integrated additional modules to be parametrized in a system-dependent or user-dependent manner.

Such parametrizable properties may be, for example, the response voltage, the TOV values for tripping, set values for the surge protection function or the short-circuit current in the network.

As already mentioned, the teaching according to the invention offers the possibility for the overvoltage protection devices to communicate with each other but also with a central unit while using the bidirectional interface.

A further approach according to the invention is that the parametrization mentioned above can also be realized with respect to lower-level terminal devices to be protected. If, for instance, critical harmonic spectra are determined at the respective installation locations by the additional module for detecting properties in this respect, active filters may be set, i.e. parametrized upstream of or in the terminal devices. Parametrization data modified in this respect can then be transmitted, also using the bidirectional interface, to a higher-level control and evaluation system.

In a further development of the invention, there is the option for the respective overvoltage protection devices to have an integrated Internet access in order to permit communication in this respect using a classical app so that messages may also be output to a smart phone, a laptop, a tablet, a personal computer or the like, or a data input may be performed via such devices.

Finally, the solution according to the invention creates the option of forming a system of overvoltage protection devices in a specific network with monitoring function. Hereby, an intelligent task division of surge arresters used along with enhanced protection options for terminal devices can be realized.

The overvoltage protection device according to the invention accordingly has an integrated self-diagnostics function of all of the load parameters which are relevant for the overvoltage protection device. These may be, for example, surge current-induced loads, temperature loads, TOV voltages and the like.

These parameters as a whole reflect the load and the remaining service life of the corresponding device or the overvoltage protection device. According to the invention, the mentioned parameters are reported to higher-level system facilities and evaluated there, and used for maintenance and service purposes but also for statistical analyses.

The overvoltage protection devices according to the invention also have functionally integrated modules which, as already exposed, detect network-relevant data, for example harmonics, impedance ratios of the feeding network, voltage fluctuations and the like. These network-relevant pieces of information serve the own use, on the one hand, i.e. the specific parametrization and adaptation of the protection devices. On the other hand, the obtained pieces of information also serve a external use. Thus, pieces of information acquired on site about harmonics, voltage fluctuations and impedance ratios could be forwarded to energy supply companies and be evaluated there in order to obtain a complex insight with respect to the relevant network.

The wide distribution of overvoltage protection devices at many network positions results in a particularly simple option of obtaining this extensive overview over the respective network situation in real-time.

A further aspect according to the invention is the self-parametrization. This is understood as the user's option to set or predefine properties of the protection devices as required and dependent on the network situation via suitable communication interfaces.

By way of example, this may be values concerning the response characteristics, i.e. the protective level of the overvoltage protection device and namely dependent on respective terminal devices. Furthermore, it is possible for the determined impedance data to be used to set the tripping characteristics of associated overvoltage protection devices, but also to change a previously made setting. This is helpful whenever volatile short-circuit current values occur in the networks, and namely in particular in networks having a high percentage of regenerative energy sources.

The use of the overvoltage protection devices according to the invention not only results in an improved protection of the respective terminal device, but a complex system with feedback on the network properties can be realized.

SEQUENCE LISTING

Not Applicable

What is claimed is:

1. An overvoltage protection device with monitoring and communication functions, having at least one surge arrester with a self-diagnostics unit and a wireless and/or wired interface for data transmission,
characterized in that
a further additional module is provided to detect a behavior and/or properties of a connected electrical energy source and network-relevant properties, a bidirectional exchange of data and commands to and between a higher-level control system and among multiple overvoltage protection devices take place and parametrization of lower-level terminal devices to be protected and/or the overvoltage protection devices is realized via the interface,
wherein the parametrization is performed according to the protection requirements and the network situation, and
wherein the parametrization comprises setting of a response voltage, of a temporary overvoltage value for tripping, a value for surge protection function and/or a short-circuit current in the network and/or setting of active filters upstream of the terminal devices.

2. The overvoltage protection device according to claim 1, characterized in that
the overvoltage protection device features a device for direct Internet communication.

3. The overvoltage protection device according to claim 1, characterized in that
the additional module determines impedance conditions of the feeding network, and a self-parametrization of the tripping characteristics of the respective protection device is performed according thereto.

4. A system comprised of a plurality of bidirectionally communicating, interlinked overvoltage protection devices according to claim 1.

* * * * *